United States Patent [19]
Hajime et al.

[11] Patent Number: 5,756,399
[45] Date of Patent: May 26, 1998

[54] PROCESS FOR MAKING SEMICONDUCTOR WAFER

[75] Inventors: Hirofumi Hajime; Toshiharu Yubitani, both of Miyazaki, Japan

[73] Assignee: Komatsu Electronic Metals Co. Ltd., Hiratsuka, Japan

[21] Appl. No.: 826,226

[22] Filed: Mar. 27, 1997

[30] Foreign Application Priority Data

Mar. 29, 1996 [JP] Japan .................... 8-112915

[51] Int. Cl.$^6$ .................................. H01L 41/22
[52] U.S. Cl. .................. 438/692; 216/52; 216/89
[58] Field of Search .................. 216/38, 52, 89, 216/96; 438/692

[56] References Cited

U.S. PATENT DOCUMENTS 4,588,473  5/1986  Hisatomi et al. .......... 156/645
5,591,502  1/1997  Kaneko et al. ............ 428/65.3

FOREIGN PATENT DOCUMENTS 61-292981  12/1986  Japan .

*Primary Examiner*—R. Bruce Breneman
*Assistant Examiner*—George Goudreau
*Attorney, Agent, or Firm*—Varndell Legal Group

[57] ABSTRACT

The present invention provides a process for making a semiconductor wafer, including slicing an ingot to obtain wafers; surface-grinding both sides of each of the wafers; etching the wafers with an alkaline solution; chamfering the peripheral portion of each of the wafers; both-side polishing the wafers for mirror processing ; cleaning both sides of each of the wafers to remove the particles attached to the sides; and drying and cleaning the wafers. By employing the present process, the time for polishing the wafer can be shortened, and the semiconductor wafer can be made effectively.

3 Claims, 5 Drawing Sheets

PROCESS FOR MAKING SEMICONDUCTOR WAFER

BACKGROUND OF THE INVENTION

1. Field of the Invention

The present invention relates to a process for making a semiconductor wafer by surface-grinding one side or both sides of the wafer and then polishing the wafer.

2. Description of the Prior Art

Conventionally, the semiconductor wafer made by surface-grinding and then mirror polishing is made by the following steps (shown in the flow chart of FIG. 4).

(1) A silicon single crystal ingot is sliced by an inner diameter saw to obtain wafers 5 (referring to FIG. 5(a)).

(2) To prevent the chipping on peripheral portion 51 of each of the sliced wafers 5, the peripheral portion 51 is subjected to chamfering (referring to FIG. 5(b)).

(3) One side 52 and other side 53 of each of the chamfered wafers is subjected to surface-grinding to form a uniform thickness (referring to FIG. 5(c)).

(4) The one side 52 or both sides (52 and 53) of each of the surface-ground wafers 5 is subjected to polishing (referring to FIG. 5(d)). Thus, damage layers 54 generated by the surface-grinding can be removed (referring FIG. 5(c)).

(5) After the mirror processing, the wafer is cleaned with a chemical solution to remove impurities such as heavy metal and particles.

However, according to the conventional process, since the depth of the damage layers generated by the surface-grinding is about 2 to 10 μm, therefore, the surface-ground wafers should be subjected to more than 10 μm of polishing, and such a polishing step is time-consuming.

SUMMARY OF THE INVENTION

An object of the present invention is to solve the above-mentioned problems and provide a process for making semiconductor wafers. By the present invention such a process, the time required for polishing the surface-ground wafers can be shortened, thus making the semiconductor wafer effectively.

According to one aspect of the present invention, the process for making a semiconductor wafer includes slicing an ingot to obtain wafers; surface-grinding one side or both sides of each of the sliced wafers; etching the surface-ground wafers with an alkaline solution; chamfering the peripheral portion of each of the alkaline solution-etched wafers; and polishing the one side or the both sides of each of the chamfered wafers.

According to a second aspect of the present invention, the process for making a semiconductor wafer includes slicing an ingot to obtain wafers; roughly chamfering the peripheral portion of each of the sliced wafers; surface-grinding one side or both sides of each of the roughly chamfered wafers; etching the surface-ground wafers with an alkaline solution; final chamfering the peripheral portion of each of the alkaline solution-etched wafers; and polishing the one side or the both sides of each of the final chamfered wafers.

According to a third aspect of the present invention, the process for making a semiconductor wafer includes slicing an ingot to obtain wafers; surface-grinding both sides of each of the sliced wafers; etching the surface-ground wafers with an alkaline solution; chamfering the peripheral portion of each of the alkaline solution-etched wafers; and both-side polishing the chamfered wafers to polish the both sides of the chamfered wafers simultaneously.

DETAILED DESCRIPTION OF THE INVENTION

According to the conventional technique, the surface-ground wafer is subjected to polishing for mirror processing and removing the damage layer generated by surface-grinding. However, according to the present invention, before polishing, the surface-ground wafer is subjected to etching with an alkaline solution to remove the damage layer, then the peripheral portion of the alkaline solution etched wafer is subjected to chamfering, and finally the wafers are polished.

Therefore, according to the process for making the semiconductor wafer of the present invention, since a great amount of wafers can be treated when performing alkaline etching, the processing time for polishing can be shortened, thus the total time for making the semiconductor wafers can be greatly shortened.

The flatness of the wafer obtained from using acid etching with a mixed acid is worse than that obtained from using alkaline etching. To maintain the flatness after the surface-grinding, and to perform polishing after etching smoothly, etching with an alkaline solution is preferable.

The etching solution suitable for use in the process of the present invention can be any alkaline solution used for etching semiconductor wafers. However, especially to maintain the flatness, it is preferable to use potassium hydroxide, sodium hydroxide, ammonia or amine.

Further, although better flatness can be obtained by alkaline etching, due to the selective etching with respect to the crystallographic axis, etch pits may be formed on the etching surface. Although etch pits on the one side or the both sides of the wafer can be removed by polishing, those on the peripheral portion of the wafer can not be removed. Therefore, chamfering should be employed before polishing in order to remove etch pits on the peripheral portion of the wafer.

The embodiments of the present invention will be explained with reference by the figures.

Embodiment 1

Figure 1:
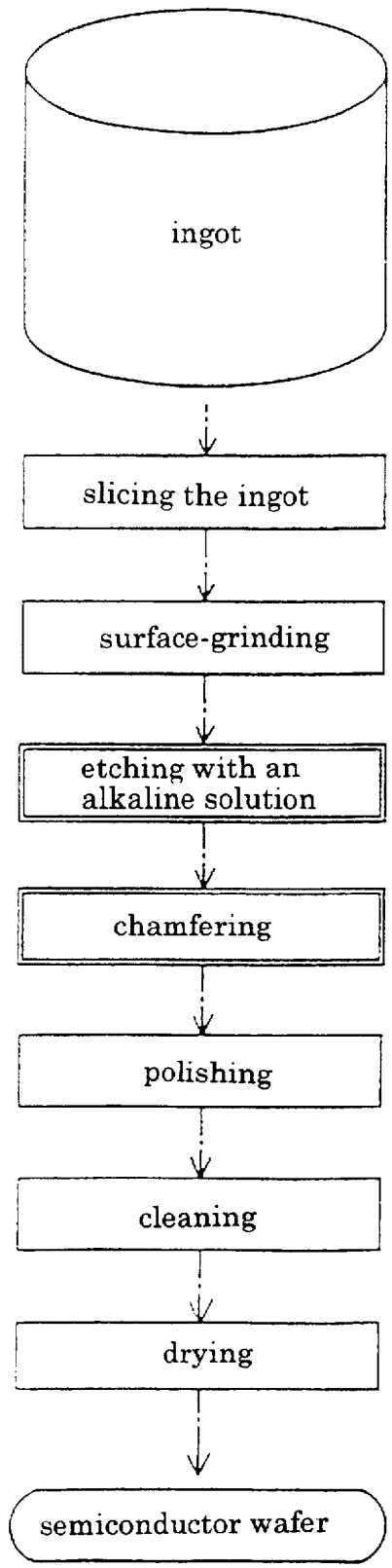
FIG. 1 shows a flow chart of the process for making the semiconductor wafers of Embodiment 1.

FIG. 1 shows a flow chart of the process for making the semiconductor wafers of Embodiment 1. FIG. 2(a)–(e) are cross-sectional views of the semiconductor wafer made according to Embodiment 1.

The semiconductor wafers of Embodiment 1 are made by the following steps as shown in FIG. 1. (1) An ingot was sliced to obtain wafers 1 (referring to FIG. 2(a)). (2) Each of the sliced wafer 1 was supported by a grinding chuck (not shown) and the both sides of the sliced wafers were subjected to surface-grinding to form a uniform thickness. The damage layer formed on the one side 1a and the other side 1b of each of the surface-ground wafers 1 (referring to FIG. 2(b)). Each of the surface-ground wafer 1 was etched with an alkaline solution. By this, although the damage layer 2 generated by surface-grinding was removed, etch pits 3 due to alkaline etching were formed on the whole sides of each of the wafers 1 (referring to FIG. 2(c)).

Figure 2A:
FIG. 2(a)–(e) are cross-sectional views of the semiconductor wafers made according to Embodiment 1.
Figure 2B:
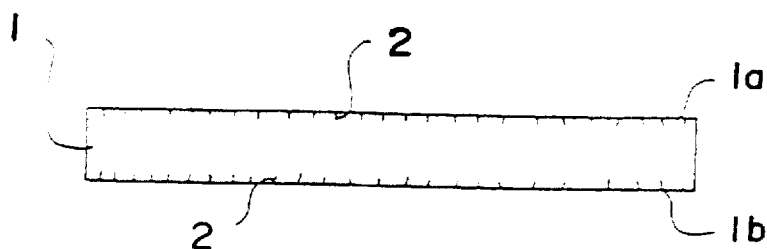
Figure 2C:
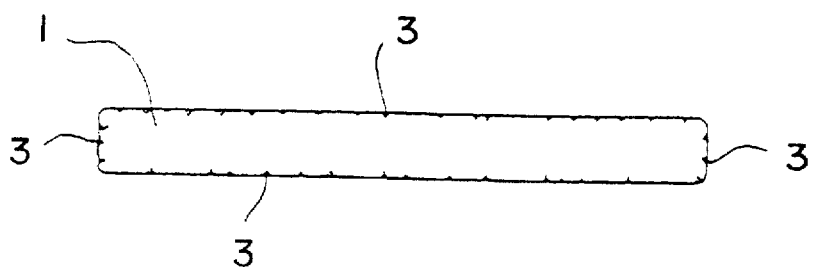
Figure 2D:
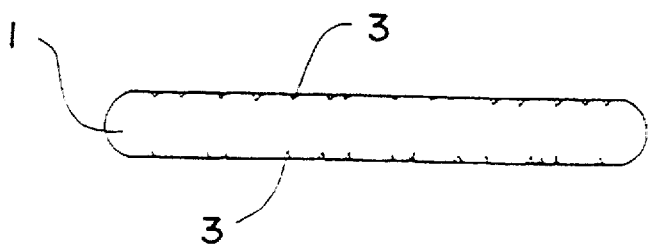

(4) The peripheral portion 1c of each of the alkaline etched wafers 1 was subjected to chamfering to remove the etch pits 3 on the peripheral portion 1c (referring to FIG. 2(d)).

Figure 2E:
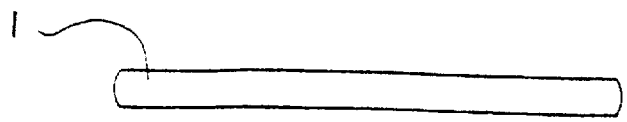

(5) The chamfered wafers 1 was subjected to both-side polishing and removing etch pits 3 on the one side 1a and the other side 1b of each of the wafers 1 (referring to FIG. 2(e)).

(6) Each of the both-side polished wafers 1 was cleaned to remove the particles attached to the wafers sides.

(7) Each of the cleaned wafers 1 was dried to obtain the semiconductor wafers of the present invention.

According to the conventional process, more than 10 μm on a single side should be polished away during polishing. However, according to the process of the present invention, only about 5 μm on a single side can be polished away. Therefore, the polishing time of the present invention is only about a half of that of the conventional process. In addition, several tens of wafers can be treated during etching, so the efficiency of the present invention can be greatly enhanced over the conventional art.

Further, the both-sides polishing of Embodiment 1 can be attained by first polishing one side and then polishing the other side to polish the both sides of the wafers, or alternatively, by polishing the both sides simultaneously by a both-side polishing machine.

Still further, according to the above description, the both sides are polished, however, to meet the requirements of products, it is applicable to only polish a single side of each of the wafers.

Embodiment 2

Figure 3:
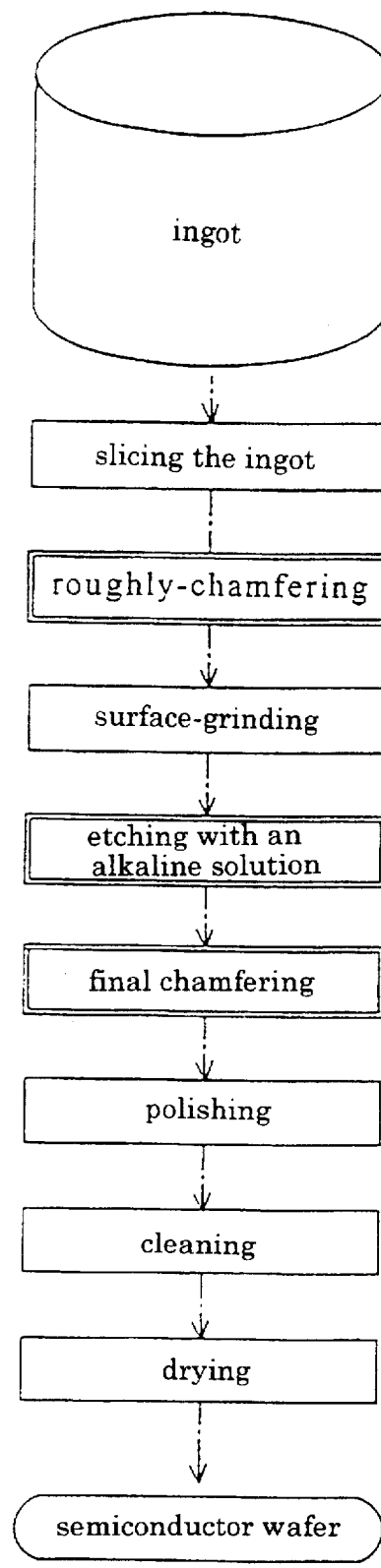
FIG. 3 shows a flow chart of the process for making the semiconductor wafers of Embodiment 2.
Figure 4:
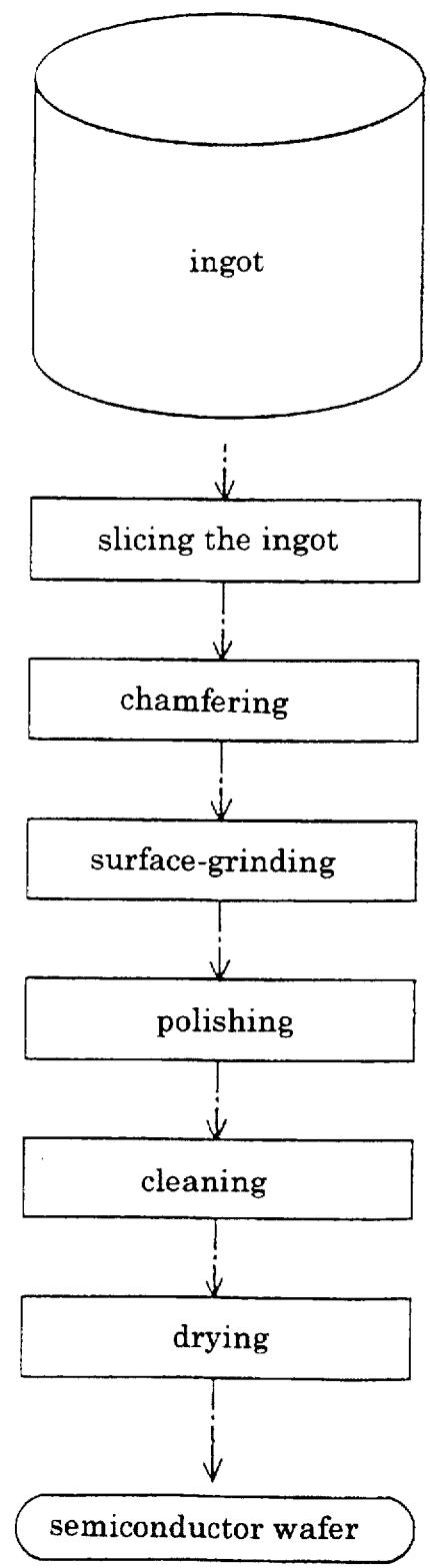
FIG. 4 shows a flow chart of the process for making semiconductor wafers according to the conventional technique.
Figure 5A:
FIG. 5(a)–(d) are cross-sectional views of the semiconductor wafers made according to the process of the conventional technique.
Figure 5B:
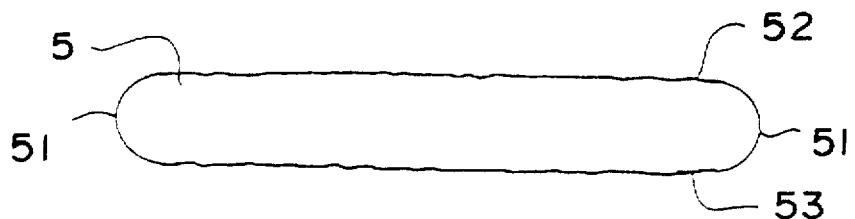
Figure 5C:
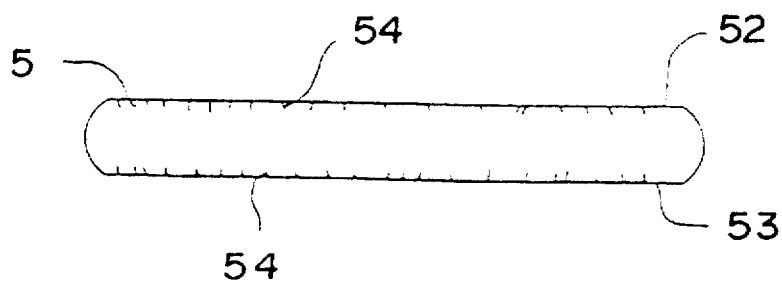
Figure 5D:
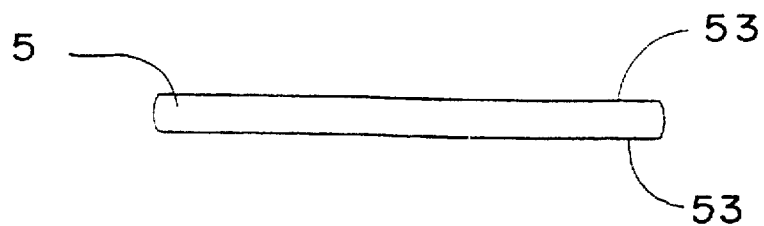

FIG. 3 shows a flow chart of the process for making the semiconductor wafers of Embodiment 2.

According to the above Embodiment 1, the wafer sliced from an ingot is directly subjected to surface-grinding, and some chipping are formed on the peripheral portion of the surface-ground wafer by the surface-grinding. Since such chipping can be almost completely removed by the chamfering after etching, no serious problems will occur to the final products.

However, when semiconductor wafers with higher quality should be made according to the requirements, before surface-grinding, the peripheral portion of the wafer is subjected to roughly-chamfering as shown in FIG. 3. After that, alkaline etching as mentioned in the above embodiment is employed, and then final chamfering is employed to remove etch pits formed by alkaline etching.

By employing the process of the present invention, the processing time for polishing can be shortened, and the semiconductor wafers can be made effectively.

What is claimed is:

1. A process for making a semiconductor wafer, comprising the following steps of:

(1) slicing an ingot to obtain wafers;

(2) surface-grinding one side or both sides of each of the wafers;

(3) etching the wafers with an alkaline solution;

(4) chamfering a peripheral portion of each of the wafers; and (5) polishing the one side or the both sides of each of the wafers.

2. A process for making a semiconductor wafer, comprising the following steps of:

(1) slicing an ingot to obtain wafers;

(2) roughly chamfering a peripheral portion of each of the wafers;

(3) surface-grinding one side or both sides of each of the wafers;

(4) etching the wafers with an alkaline solution;

(5) final chamfering the peripheral portion of each of the wafers; and (6) polishing the one side or the both sides of each of the wafers.

3. A process for making a semiconductor wafer, comprising the following steps of:

(1) slicing an ingot to obtain wafers;

(2) surface-grinding both sides of each of the sliced wafers;

(3) etching the wafers with an alkaline solution;

(4) chamfering a peripheral portion of each of the wafers; and (5) both-side polishing the wafers to polish the both sides of the wafers simultaneously.

* * * * *